(12) United States Patent
Guo et al.

(10) Patent No.: US 11,012,226 B2
(45) Date of Patent: May 18, 2021

(54) OSCILLATOR CALIBRATION STRUCTURE AND METHOD

(71) Applicant: Marvell Asia Pte, Ltd., Singapore (SG)

(72) Inventors: Jianmin Guo, Sunnyvale, CA (US); Jingjing Deng, Shanghai (CN); Wenjie Li, Shanghai (CN); Pilong Gao, Nanjing (CN); Hui Wang, Pleasanton, CA (US); Xin Ma, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/782,522

(22) Filed: Feb. 5, 2020

(65) Prior Publication Data

US 2020/0252195 A1 Aug. 6, 2020

Related U.S. Application Data

(63) Continuation of application No. 16/264,020, filed on Jan. 31, 2019, now Pat. No. 10,601,575.

(51) Int. Cl.
*H04L 27/00* (2006.01)
*H04L 7/00* (2006.01)
*H04L 7/033* (2006.01)
*H03L 7/099* (2006.01)
*H03L 7/085* (2006.01)

(52) U.S. Cl.
CPC ............ *H04L 7/0331* (2013.01); *H03L 7/085* (2013.01); *H03L 7/099* (2013.01); *H04L 7/0037* (2013.01)

(58) Field of Classification Search
CPC ..... H04L 7/0331; H04L 7/0037; H03L 7/085; H03L 7/099
USPC ................... 375/354, 355, 371, 376
See application file for complete search history.

(56) References Cited

U.S. PATENT DOCUMENTS

| | | | |
|---|---|---|---|
| 8,090,971 B2 | 1/2012 | Sarmento | |
| 9,306,730 B1 * | 4/2016 | Shu | ........... H03L 7/1976 |
| 9,374,217 B1 | 6/2016 | Forey et al. | |
| 10,177,897 B2 | 1/2019 | Schnell et al. | |
| 2004/0208270 A1 | 10/2004 | Schmatz et al. | |

(Continued)

OTHER PUBLICATIONS

Chien, J., et al., "A Pulse-Position-Modulation Phase-Noise-Reduction Technique for a 2-to-16GHz Injection-Locked Ring Oscillator in 20nm CMOS", *2014 IEEE International Solid-State Circuits Conference*, Feb. 10, 2014.

Lee, J., et al., "A 20Gb/s Burst-Mode CDR Circuit Using Injection-Locking Technique", *2007 IEEE International Solid-State Circuits Conference*, Feb. 12, 2007, pp. 46-48.

Maruko, K., et al., "A 1.296-to-5.184Gb/s Transceiver with 2.4mW/(Gb/s) Burst-mode CDR using Dual Edge Injection-Locked Oscillator", *2010 IEEE International Solid-State Circuits Conference*, Feb. 10, 2010, pp. 364-366.

(Continued)

*Primary Examiner* — Tesfaldet Bocure

(57) ABSTRACT

A short-reach data link receiver includes an edge detector configured to generate a pulse on an edge of a data input, a first clock-data recovery path coupled to an output of the edge detector for recovering a clock and data from the output of the edge detector, a second clock-data recovery path coupled to the output of the edge detector for recovering the clock and data from the output of the edge detector, and a controller configured to alternate between the first and second clock-data recovery paths to recover the clock and data using one of the paths while calibrating the other path. The controller may swap the paths whenever calibration of one path is completed. That may include beginning calibration of the next path immediately after swapping of the paths. Alternatively, power consumption may be reduced by delaying calibration of the next path after swapping of the paths.

14 Claims, 9 Drawing Sheets

(56) References Cited

U.S. PATENT DOCUMENTS

| | | | |
|---|---|---|---|
| 2012/0008954 A1* | 1/2012 | Tanaka | H04L 7/033 |
| | | | 398/67 |
| 2012/0189299 A1* | 7/2012 | Takashima | H04B 10/613 |
| | | | 398/25 |
| 2015/0200765 A1 | 7/2015 | Bonaccio et al. | |
| 2015/0270943 A1 | 9/2015 | Liu et al. | |
| 2015/0280761 A1* | 10/2015 | Lin | H04L 7/033 |
| | | | 375/340 |
| 2015/0349783 A1* | 12/2015 | Shibasaki | H03L 7/07 |
| | | | 331/34 |

OTHER PUBLICATIONS

Masuda, T., et al., "A 12Gb/s 0.9mW/Gb/s Wide-Bandwidth Injection-Type CDR in 28nm CMOS with Reference-Free Frequency Capture", *2016 IEEE International Solid-State Circuits Conference*, Feb. 2, 2016, pp. 188-190.

Rezayee et al., "A 9-1 Gb/S clock and Data Recovery Circuit with Three-State Phase Detector and Dual-path Loop Architecture", *IEEE*, 2003, 4 pgs.

Sutardja, S., "The Future of IC Design Innovation", *2015 IEEE International Solid-State Circuits Conference*, Feb. 23, 2015, pp. 16-21.

\* cited by examiner

OSCILLATOR CALIBRATION STRUCTURE AND METHOD

CROSS REFERENCE TO RELATED APPLICATION

This is a continuation of commonly-assigned U.S. patent application Ser. No. 16/264,020, filed Jan. 31, 2019, now U.S. Pat. No. 10,601,575, which is hereby incorporated by reference herein in its entirety.

FIELD OF USE

This disclosure relates to the calibration of an oscillator in a receiver of a short-reach data link. More particularly, this disclosure relates to a structure and method for calibration of an injection-locked oscillator in a clock-data recovery circuit in a receiver of a short-reach data link.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

Short-reach data links are sometimes used for chip-to-chip communication when a reliable serial interface using low power at high speed is required. For example, as smaller semiconductor process nodes are developed, the cost of semiconductor devices increases. Therefore, there is an increasing prevalence of electronic devices that include multiple interconnected chips. In some cases, a more advanced process node is used only in an integrated circuit chip on which functions that require fast processing and high power consumption are implemented. Conversely, other less demanding features, such as legacy input/output features and other peripheral features, can be implemented on one or more integrated circuit chips at an older process node. The separate integrated circuit chips are then interconnected using one or more short-reach data links.

One advantage of a short-reach data link is low channel loss (~−12 dB). With such low channel loss, injection-locked oscillator-based (ILO-based) clock-data recovery (CDR) is practical. However, for ILO-based CDR to function correctly, the ratio of the oscillator free-running frequency (FRF) to the data rate must be kept constant.

SUMMARY

A short-reach data link receiver in accordance with implementations of the subject matter of this disclosure includes an edge detector configured to generate a pulse on an edge of a data input, a first clock-data recovery path coupled to an output of the edge detector for recovering a clock and data from the output of the edge detector, a second clock-data recovery path coupled to the output of the edge detector for recovering the clock and data from the output of the edge detector, and a controller configured to alternate between the first clock-data recovery path and the second clock-data recovery path to recover the clock and data using one of the first and second clock-data recovery paths in the pair while calibrating another of the first and second clock-data recovery paths.

In a first implementation of such a short-reach data link receiver, the controller may be configured to swap, at predetermined time intervals, the first one of the first and second clock-data recovery paths and the second one of the first and second clock-data recovery paths.

In a first variant of that first implementation, the predetermined time interval may be selected to be at most equal to an operational duration during which temperature drift will cause the first one of the first and second clock-data recovery paths to lose calibration.

In a second variant of that first implementation, the controller may be configured to swap the first one of the first and second clock-data recovery paths and the second one of the first and second clock-data recovery paths whenever calibration of the second one of the first and second clock-data recovery paths is completed.

In the second variant of the first implementation, the controller may be configured to begin calibration of a next one of the first and second clock-data recovery paths to be calibrated immediately after swapping of the first and second clock-data recovery paths. Alternatively, in the second variant of the first implementation, the controller may be configured to delay calibration of a next one of the first and second clock-data recovery paths to be calibrated for a portion of the predetermined interval after swapping of the first and second clock-data recovery paths.

In a second implementation of such a short-reach data link receiver, each respective one of the first and second clock-data recovery paths may include an injection-locked oscillator configured to recover the clock by injection-locking a reference frequency to the output of the edge detector, and a demultiplexer configured to operate on the data input and the recovered clock to recover data.

In a first variant of the second implementation, each respective one of the first and second clock-data recovery paths may further include circuitry configured to compare respective polarities of signals in the first and second clock-data recovery paths and to adjust the respective polarities of signals in the first and second clock-data recovery paths when the respective polarities of the signals in the first and second clock-data recovery paths are different.

In that first variant of the second implementation, the circuitry configured to compare respective polarities of signals in the first and second clock-data recovery paths may include an exclusive-OR circuit having as inputs a corresponding signal from each of the first and second clock-data recovery paths, and the circuitry configured to adjust the polarities of signals in the first and second clock-data recovery paths when the polarities of the signals in the first and second clock-data recovery paths are different may include at least one multiplexer controlled by an output of the exclusive-OR circuit.

In a second variant of the second implementation, the injection-locked oscillator may include a ring oscillator having a transistor configured to receive the output of the edge detector and to connect together two opposite poles of a ring oscillator component upon receipt of the pulse in the output of the edge detector.

A third variant of the second implementation may further include a delay line on the data input at the demultiplexer to compensate for clock recovery delay in the injection-locked oscillator.

A method in accordance with implementations of the subject matter of this disclosure of operating a short-reach data link receiver having an edge detector configured to generate a pulse on an edge of a data input, a first clock-data recovery path coupled to an output of the edge detector for recovering a clock from the output of the edge detector and a second clock-data recovery path coupled to the output of the edge detector for recovering the clock from the output of the edge detector, includes using a first one of the first and second clock-data recovery paths to recover the clock from the output of the edge detector, using the first one of the first and second clock-data recovery paths to recover data from the data input with the recovered clock, and calibrating a second one of the first and second clock-data recovery paths while using the first one of the first and second clock-data recovery paths.

A first implementation of such a method may further include swapping, at predetermined time intervals, the first one of the first and second clock-data recovery paths and the second one of the first and second clock-data recovery paths.

A first variant of the first implementation may further include selecting the predetermined time interval to be at most equal to an operational duration during which temperature drift will cause the first one of the first and second clock-data recovery paths to lose calibration.

In a second variant of the first implementation, the swapping may include swapping the first one of the first and second clock-data recovery paths and the second one of the first and second clock-data recovery paths whenever calibration of the second one of the first and second clock-data recovery paths is completed.

That second variant of the first implementation may include beginning calibration of a next one of the first and second clock-data recovery paths to be calibrated immediately after swapping of the first and second clock-data recovery paths. Alternatively, the second variant of the first implementation may include reducing power consumption by delaying calibration of a next one of the first and second clock-data recovery paths to be calibrated for a portion of the predetermined interval after swapping of the first and second clock-data recovery paths.

A second implementation of such a method may further include comparing respective polarities of signals in the first and second clock-data recovery paths and adjusting the respective polarities of signals in the first and second clock-data recovery paths when the respective polarities of the signals in the first and second clock-data recovery paths are different.

In a variant of the second implementation, comparing respective polarities of signals in the first and second clock-data recovery paths may include performing an exclusive-OR operation on a corresponding signal from each of the first and second clock-data recovery paths, and adjusting the polarities of signals in the first and second clock-data recovery paths when the respective polarities of the signals in the first and second clock-data recovery paths are different may include multiplexing the signals under control of an output of the exclusive-OR operation.

A third implementation of such a method may further include delaying the data input to compensate for clock recovery delay.

In a fourth implementation of such a method, using the first one of the first and second clock-data recovery paths to recover the clock from the output of the edge detector may include injection-locking a reference frequency to the output of the edge detector in the first one of the first and second clock-data recovery paths.

In a variant of the fourth implementation, the calibrating the second one of the first and second clock-data recovery paths while using the first one of the first and second clock-data recovery paths may include calibrating an oscillator in the second one of the first and second clock-data recovery paths to the reference frequency.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
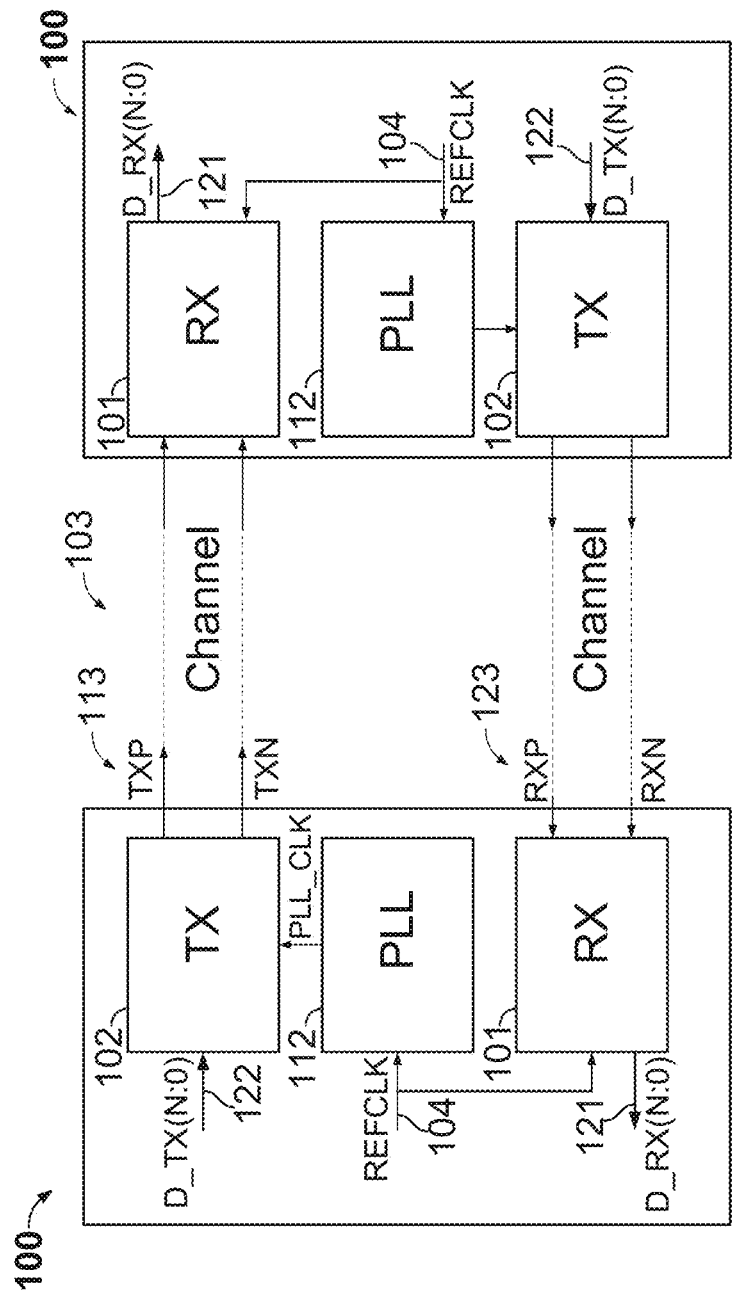
FIG. 1 is a block diagram of portions of respective integrated circuit devices incorporating respective transceivers used in a short-reach data link incorporating implementations of the subject matter of the present disclosure.

As noted above, short-reach data links are suitable for use between different integrated circuit chips under certain circumstances, such as when different parts of a system are implemented on different integrated circuit chips. As further noted above, low channel loss in a short-reach data link allows the use of ILO-based CDR. However, for ILO-based CDR to function correctly, the ratio of the free-running frequency (FRF) of the injection-locked oscillator to the data rate must be kept constant. Otherwise, large FRF error resulting from PVT drift (particularly temperature changes) will reduce tracking performance and make it difficult to support a data pattern with a long run of consecutive identical digits (CIDs).

Some known ILO-based CDR solutions use a phase-locked loop (PLL) along with the ILO for frequency tracking. However, such a solution requires substantial additional die area and increases power consumption.

Other known ILO-based CDR solutions use a phase detector (PD) to estimate the FRF error. The falling edge of the data is used for injection, and the rising edge of the data is used for FRF error sampling. However, the residual phase error sampled by the phase detector includes three components:

$$\Delta P_{tot} = \Delta P_{FRF\_ERR} + \Delta P_{DCD} + \Delta P_{ISI}$$

where $\Delta P_{tot}$ is the total phase difference, $\Delta P_{FRF\_ERR}$ is the integral of the FRF error, $\Delta P_{DCD}$ is the duty cycle distortion of the data, plus the sampling setup time difference between the rising edge and the falling edge, and $\Delta P_{ISI}$ is the inter-symbol interference (ISI) between the injection data edge and the FRF error sampling data edge. Because the phase difference includes components other than the FRF error, poor FRF tracking accuracy may result from using phase detection to measure the FRF error. Such an implementation may be able to support, for example, a PRBS9 8-bit/10-bit pattern, but cannot support, for example, a random data pattern with a long run of CIDs.

With designs that call for phase drift, resulting from FRF error, of no more than 10% of a unit interval (UI) after 100 CIDs, FRF tracking accuracy better than 1,000 parts-per-million (ppm) is required.

In accordance with implementations of the subject matter of the present disclosure, the transceiver of a short-reach data link includes a receiver structure using ILO-based CDR, having two injection-locked paths. One of the injection-locked paths operates in clock-data recovery mode, while the other one of the injection-locked paths operates in a calibration mode, in which its oscillator is calibrated to a constant ratio to the reference clock, which (because, the data rate is at a constant ratio to the reference clock) is a constant ratio to the data rate. In some such implementations, the system is designed to swap paths after one of the paths operates in clock-data recovery mode for no longer than an operational duration based on the target frequency and the target margin of FRF error (example provided below). As discussed in more detail below, after a swap, the path that had been operating in calibration mode switches immediately into clock-data recovery mode. However, calibration may take less time than the operational duration of each injection-locked path. Therefore, the path that had been operating in clock-data recovery mode may not enter calibration mode immediately after concluding operation in the clock-data recovery mode, but instead may enter an idle mode, or low-power mode, for a portion of the operational duration before entering calibration mode.

Two integrated circuit devices, each incorporating a respective transceiver 100, and connected by a short-reach data link incorporating implementations of the subject matter of the present disclosure, are shown in FIG. 1. Each integrated circuit device incorporates a respective transceiver 100 as well as other operational circuitry (not shown). Each transceiver 100 includes a receiver 101 and a transmitter 102. A clock standard circuit 112 (as depicted, the clock standard is a PLL, but may be any other type of clock standard such as a digital PLL, or a delay-locked loop (DLL)) is provided to control the transmit clock/frequency of transmitter 102. An (N+1)-bit data signal 122 originating on the integrated circuit chip on which transceiver 100 is present is input to transmitter 102 and transmitted at 113 onto channel 103 of the short-reach data link between the integrated circuit chips on which the respective transceivers 100 are located. As depicted in FIG. 1, channel 103 uses differential signaling, but a single-ended channel also may be provided.

Receiver 101 receives an (N+1)-bit signal 123 on channel 103, and recovers data 121. The same reference clock signal 104 is provided to both clock standard circuit 112 and receiver 101. Receiver 101 does not need a clock/frequency signal from clock standard circuit 112 because receiver 101 recovers the clock from signal 123 as part of the ILO-based CDR process. However, the reference clock is used as a timer to correct the oscillator FRF in receiver 101, as discussed below.

Figure 2:
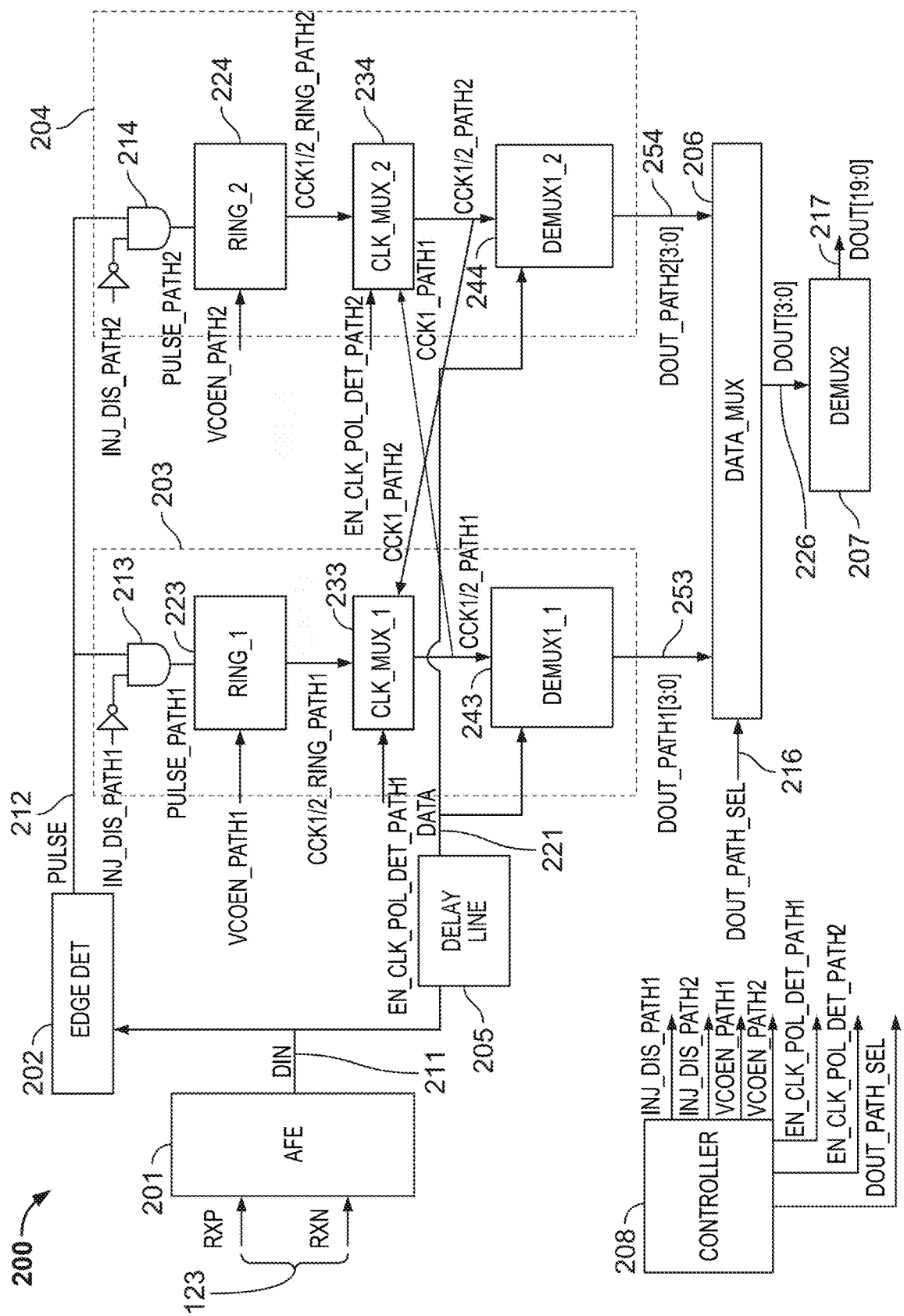
FIG. 2 is a schematic representation of an implementation of a receiver in the transceiver of FIG. 1.

An implementation 200, according to the subject matter of the present disclosure, of a receiver 101 is shown in FIG. 2. Receiver 200 includes an analog front-end (AFE) 201 that converts the analog differential signal 123 to a digital data_in (DIN) signal 211. An edge detector 202 provides a pulse signal 212 in which there is a pulse for each rising or falling edge of DIN signal 211. Pulse signal 212 is input to each of two ILO-based CDR paths 203, 204. Each ILO-based CDR path 203, 204 includes a respective half-rate ILO 223, 224. A respective gate 213, 214 is used to turn on or off the CDR operation in respective ILO-based CDR path 203, 204 by applying respective INJ-DIS-PATHn (n=1,2) to respective gate 213, 214.

At any given time, one of ILO-based CDR paths 203, 204 will be operating in clock-data recovery mode. In clock-data recovery mode, a pulse on signal 212 is input into respective half-rate ILO 223, 224, which may in some implementations have the structure 300 seen in FIG. 3, including respective two-stage ring oscillator 301 and respective transistor switch 302. Two-stage ring oscillator 301 operates as a voltage-controlled oscillator when the pulse signal 212 is equal to '0'. Increasing or decreasing the oscillator supply voltage VDD of the ring oscillator 301 will increase or decrease the FRF of ring oscillator 301 (calibration of the FRF is discussed below). Injection of pulses of pulse signal 212 to respective switch 302 shorts together the two rails 313, 323 of respective ring oscillator 301 on occurrence of each pulse, eventually causing injection-locking of respective ILO 223, 224 to the clock of DIN signal 211.

The two-stage ILO 300 provides an ILO edge clock ECK1/2_RING for each respective path 203, 204, locked to the rising or falling edge of DIN signal 211. A second ILO clock signal CCK1/2_RING also is provided for sampling each respective path 203, 204, 90° out of phase with ILO edge clock ECK1/2_RING, because data should be sampled midway between the rising and falling edges rather than on the rising and falling edges.

After passing through respective clock multiplexer CLK_MUX_1 (233), CLK_MUX_2 (234), whose function will be described below in connection with FIGS. 5 and 6, respective ILO clock signal CCK1/2_PATH1, CCK1/2_PATH2 is available to sample DATA signal 221 in respective demultiplexer DEMUX1_1 (243), DEMUX1-2 (244). DATA signal 221 is DIN signal 211, delayed by delay line 205 to account for time used to derive CCK1/2_PATH1, CCK1/2_PATH2 (in this implementation, these signals, designated "1/2", are differential signals) by respective ILO 223, 224. Because sampling occurs based on rising and falling edges, respective demultiplexer DEMUX1_1 (243), DEMUX1-2 (244) has a two-bit input signal, which in the implementation shown is demultiplexed into respective four-bit signal DOUT_PATH1[3:0] (253), DOUT_PATH2[3:0] (254). Multiplexer DATA MUX (206) selects the appropriate one of signals 253, 254, depending on which path 203, 204 is in CDR operating mode as indicated by signal DOUT_PATH SEL (216), as output signal DOUT[3:0] (226). In the implementation shown, a second demultiplexer DEMUX2 (207) demultiplexes four-bit signal 226 into a 20-bit output signal DOUT[19:0] (217).

ILO-based CDR path 203 is active when controller 208 deasserts disable signal INJ_DIS_PATH1 and selects path 203 with DOUT_PATH_SEL signal 216. ILO-based CDR path 204 is active when controller 208 deasserts disable signal INJ_DIS_PATH2 and selects path 204 with DOUT_PATH_SEL signal 216. An implementation of the timing of the swapping between paths 203, 204 will be discussed below in connection with FIG. 7. However, during any path swap, it may be necessary to adjust the polarity of the signals in the path being activated to match the polarity of the signals in the path being deactivated, to avoid discontinuities, as follows.

Figure 4:
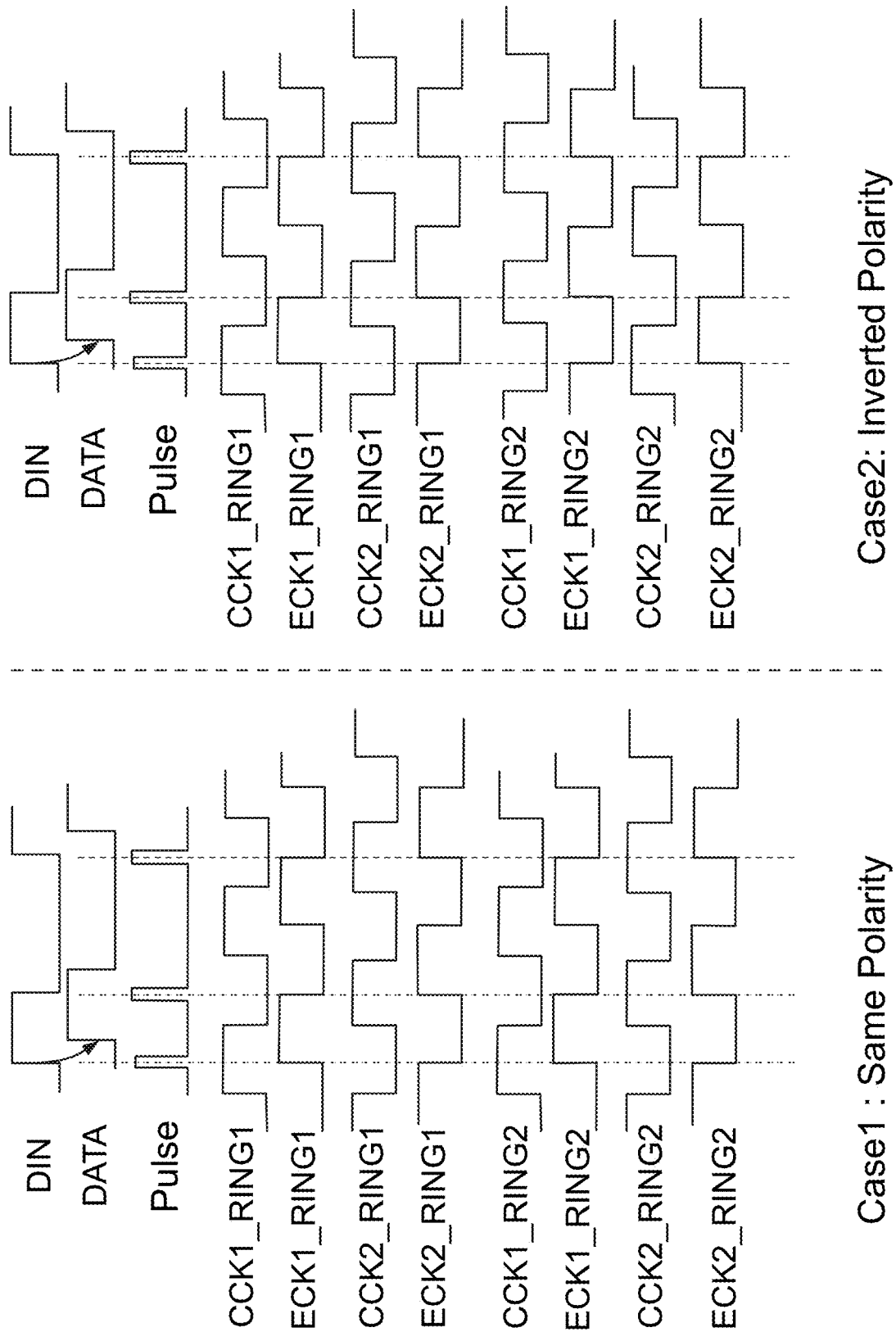
FIG. 4 illustrates two different cases of the relative polarities of signals in the two data paths of the receiver of FIG. 2.

As shown in FIG. 4, paths 203, 204 may operate, depending on conditions at that time that a pulse of pulse signal 212 closes switch 302, under either Case 1 in which CCK1_RING2, CCK2_RING2, ECK1_RING2 and ECK2_RING2 have the same polarities as CCK1_RING1, CCK2_RING1, ECK1_RING1 and ECK2_RING1, or Case 2 in which CCK1_RING2, CCK2_RING2, ECK1_RING2 and ECK2_RING2 have opposite polarities from CCK1_RING1, CCK2_RING1, ECK1_RING1 and ECK2_RING1. If Case 2 holds, then when a path swap occurs, there will be a 180° phase difference between paths of opposite polarities. To prevent discontinuities from such a phase shift when a path swap occurs, clock multiplexers CLK_MUX_1 (233), CLK_MUX_2 (234) are used to adjust the polarities of the signals in that one of paths 203, 204 that is about to enter the active CDR mode. Each clock multiplexer CLK_MUX_1 (233), CLK_MUX_2 (234) has as inputs the CCK1 signals from its own path (CCK1_PATH1 or CCK1_PATH2, respectively) and from the other path (CCK1_PATH2 or CCK1_PATH1, respectively), which are used to sense polarity. Each clock multiplexer CLK_MUX_1 (233), CLK_MUX_2 (234) also has as inputs the CCK1_RING and CCK2_RING signals from its own path (i.e., CCK1_RING_PATH1 and CCK2_RING_PATH1, or CCK1_RING_PATH2 and CCK2_RING_PATH2, respectively), which are output in different polarities depending on the polarity sensed using the CCK1 signals.

Figure 5:
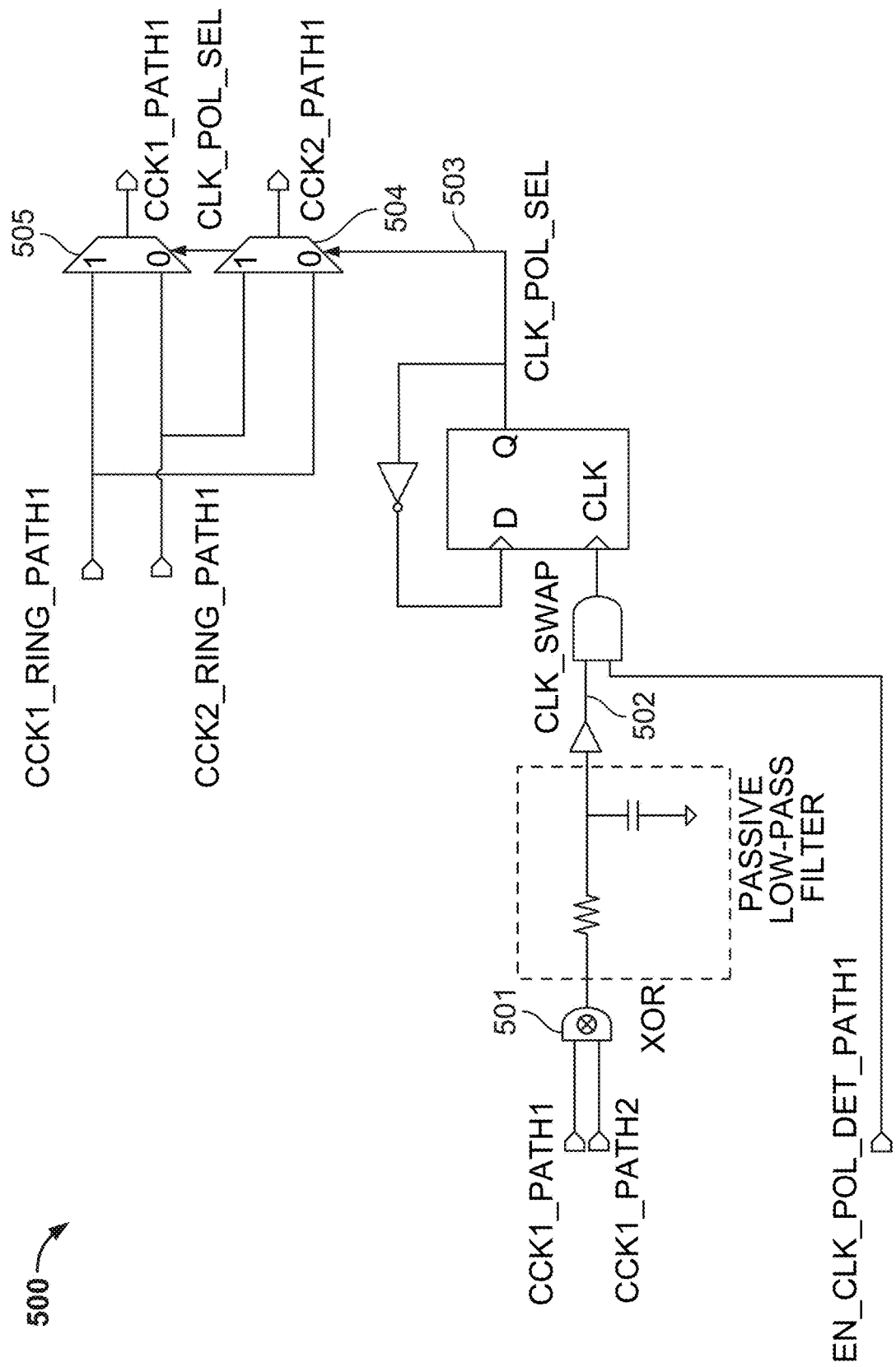
FIGS. 5 and 6 are schematic representations of circuitry for adjusting signal polarities that differ between the two data paths of the receiver of FIG. 2.

Specifically, FIG. 5 shows an implementation 500 of CLK_MUX_1 (233) which corrects the polarities in path 203 when path 203 is about to enter active CDR mode. Before switching DOUT_PATH_SEL signal 216 to path 203 and asserting INJ-DIS-PATH2 to turn off path 204, controller 208 deasserts INJ-DIS-PATH1 to allow path 203 to produce outputs, and then asserts path 203 polarity detect enable signal EN_CLK_POL_DET_PATH1 to turn on CLK_MUX_1 (233). At exclusive-OR gate 501, CCK1_PATH2 is compared to CCK1_PATH1. If CCK1_PATH2 is the same as CCK1_PATH1, CLK_SWAP signal 502 remains low. Therefore, CLK_SWAP signal 502 will not cause flip-flop 506 to toggle, so that CLK_POL_SEL signal 503 will retain its value, and the selections of multiplexers 504, 505 will not change. If CCK1_PATH2 is different from CCK1_PATH1, CLK_SWAP signal 502 becomes high causing flip-flop 506 to toggle, so that the polarity of CLK_POL_SEL signal 503 changes, causing multiplexers 504, 505 to swap the polarities of CCK1_PATH1 and CCK2_PATH1 to match the polarities of CCK1_PATH2 and CCK2_PATH2. At that point, DOUT_PATH_SEL signal 216 is set to path 203 and INJ-DIS-PATH2 is asserted to turn off path 204.

Figure 6:
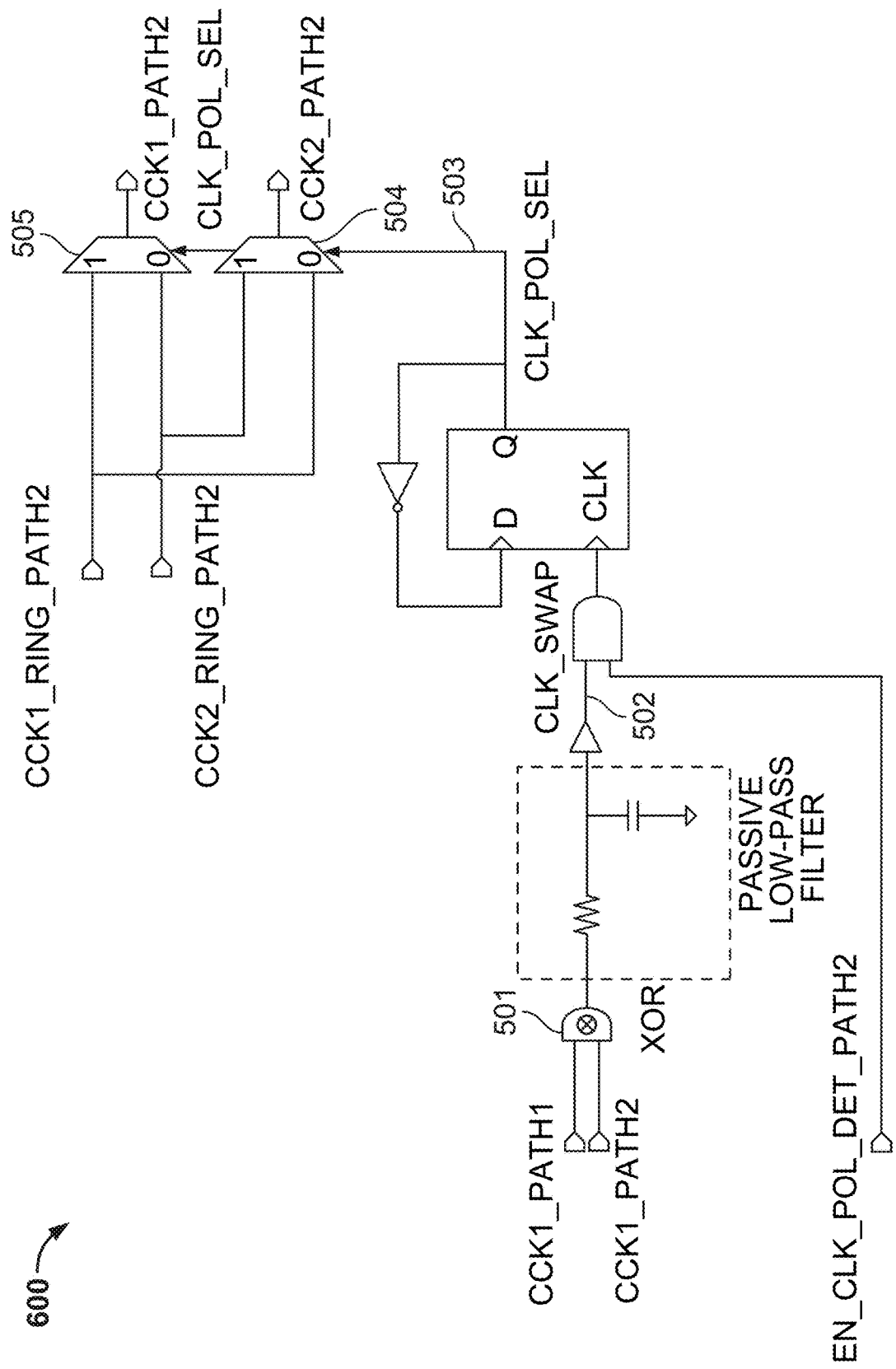

Similarly, FIG. 6 shows an implementation 600 of CLK_MUX_2 (234) which corrects the polarities in path 204 when path 204 is about to enter active CDR mode. Before switching DOUT_PATH_SEL signal 216 to path 204 and asserting INJ-DIS-PATH1 to turn off path 203, controller 208 deasserts INJ-DIS-PATH2 to allow path 204 to produce outputs, and then asserts path 204 polarity detect enable signal EN_CLK_POL_DET_PATH2 to turn on CLK_MUX2 (234). At exclusive-OR gate 501, CCK1_PATH2 is compared to CCK1_PATH1. If CCK1_PATH2 is the same as CCK1_PATH1, CLK_SWAP signal 502 remains low. Therefore, CLK_SWAP signal 502 will not cause flip-flop 506 to toggle, so that CLK_POL_SEL signal 503 will retain its value, and the selections of multiplexers 504, 505 will not change. If CCK1_PATH2 is different from CCK1_PATH1, CLK_SWAP signal 502 becomes high causing flip-flop 506 to toggle, so that the polarity of CLK_POL_SEL signal 503 changes, causing multiplexers 504, 505 to swap the polarities of CCK1_PATH2 and CCK2_PATH2 to match the polarities of CCK1_PATH1 and CCK2_PATH1. At that point, DOUT_PATH_SEL signal 216 is set to path 204 and INJ-DIS-PATH1 is asserted to turn off path 203.

Figure 7:
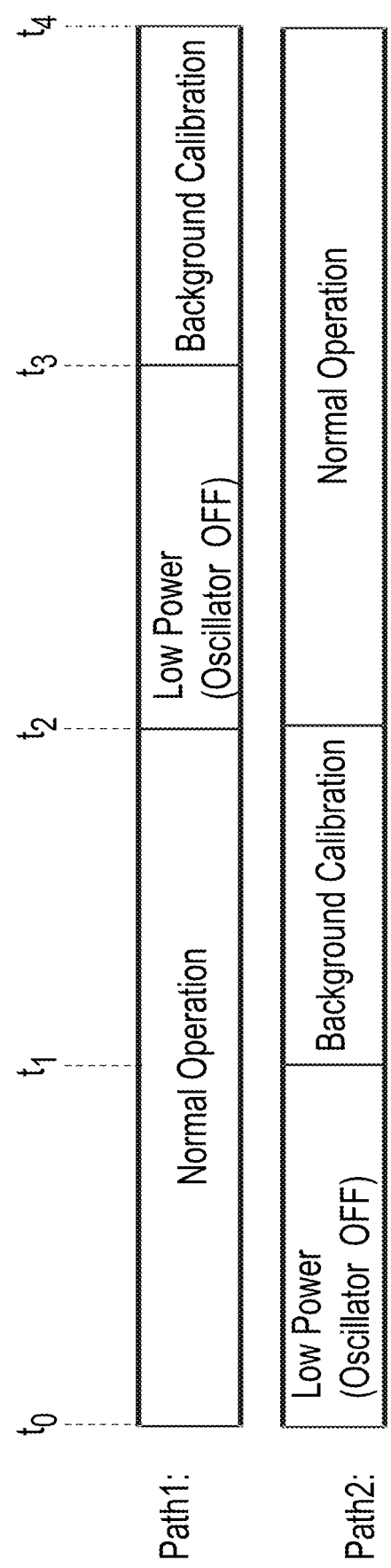
FIG. 7 is a timing diagram showing the operation of the two data paths of the receiver of FIG. 2.

FIG. 7 shows the timing of the operation of each path 203, 204 in CDR operating mode and the swapping of paths, and the timing of the background oscillator FRF calibration of that one of paths 203, 204 that is not operating, in an implementation in which background oscillator FRF calibration does not take as long as the operational duration after which an operating one of paths 203, 204 can be expected to have drifted.

As shown in FIG. 7, from time $t_0$ to time $t_2$, Path1 203 is in normal CDR operating mode. The duration from time $t_0$ to time $t_2$ is equal to an operational duration determined based on the target frequency and the target margin of FRF error (see below). However, background oscillator FRF calibration of one of paths 203, 204 can be accomplished during the duration from time $t_1$ to time $t_2$. Therefore, background oscillator FRF calibration of Path2 204 is performed between time $t_1$ and time $t_2$. When the required time for calibration is less than the period of normal operation, then between time $t_0$ and time $t_1$, Path2 204 is off (i.e., is in low-power mode), which is accomplished by controller 208 deasserting ring oscillator enable signal VCOEN_PATH2, so that ring oscillator 224 does not function either for CDR operating mode or for calibration. However, there may be implementations in which background oscillator FRF calibration of one path takes longer, and therefore occurs during the entire time that the other path is in CDR operating mode.

As soon as background oscillator FRF calibration of Path2 204 is completed at time $t_2$, Path2 204 is immediately selected for CDR operating mode, so as not to delay until after Path2 204 has had an opportunity to begin drifting. Path2 204 operates in CDR operating mode from time $t_2$ to time $t_4$. In the implementation shown, background oscillator FRF calibration of Path1 203 is performed between time $t_3$ and time $t_4$. Between time $t_2$ and time $t_3$, Path1 203 is off (i.e., is in low-power mode), which is accomplished by controller 208 deasserting ring oscillator enable signal VCOEN_PATH1, so that ring oscillator 223 does not function either for CDR operating mode or for calibration.

In addition, when the system is first powered on, before either CDR path 203, 204 begins operation, both ring oscillators 223, 224 are calibrated.

Figure 3:
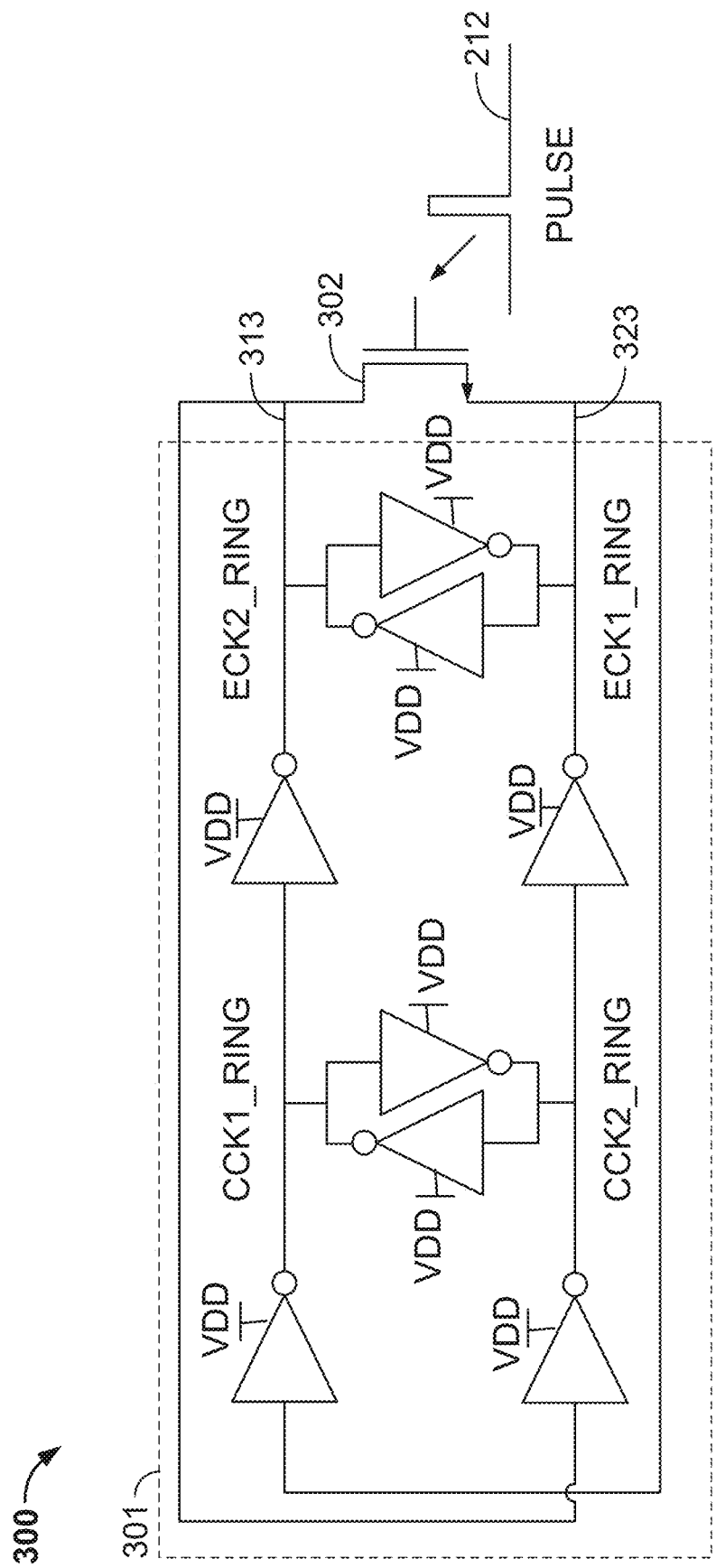
FIG. 3 is a schematic representation of an injection-locked oscillator used in implementations of the subject matter of the present disclosure.

In order to calibrate either of ring oscillators 223, 224, the respective INJ_DIS_PATH1/INJ_DIS_PATH2 signal is asserted to disconnect the respective ring oscillator 223, 224 from the injection of pulse signal 212. At start up, both signals INJ_DIS_PATH1 and INJ_DIS_PATH2 are asserted. Thus disconnected from pulse signal 212, the ring oscillator or oscillators being calibrated run freely at the oscillator FRF determined by VDD (FIG. 3). The oscillator FRF may be compared to signals derived from reference clock 104, and VDD is adjusted to adjust the oscillator FRF so that the oscillator FRF bears the desired relationship to reference clock 104.

Figure 8:
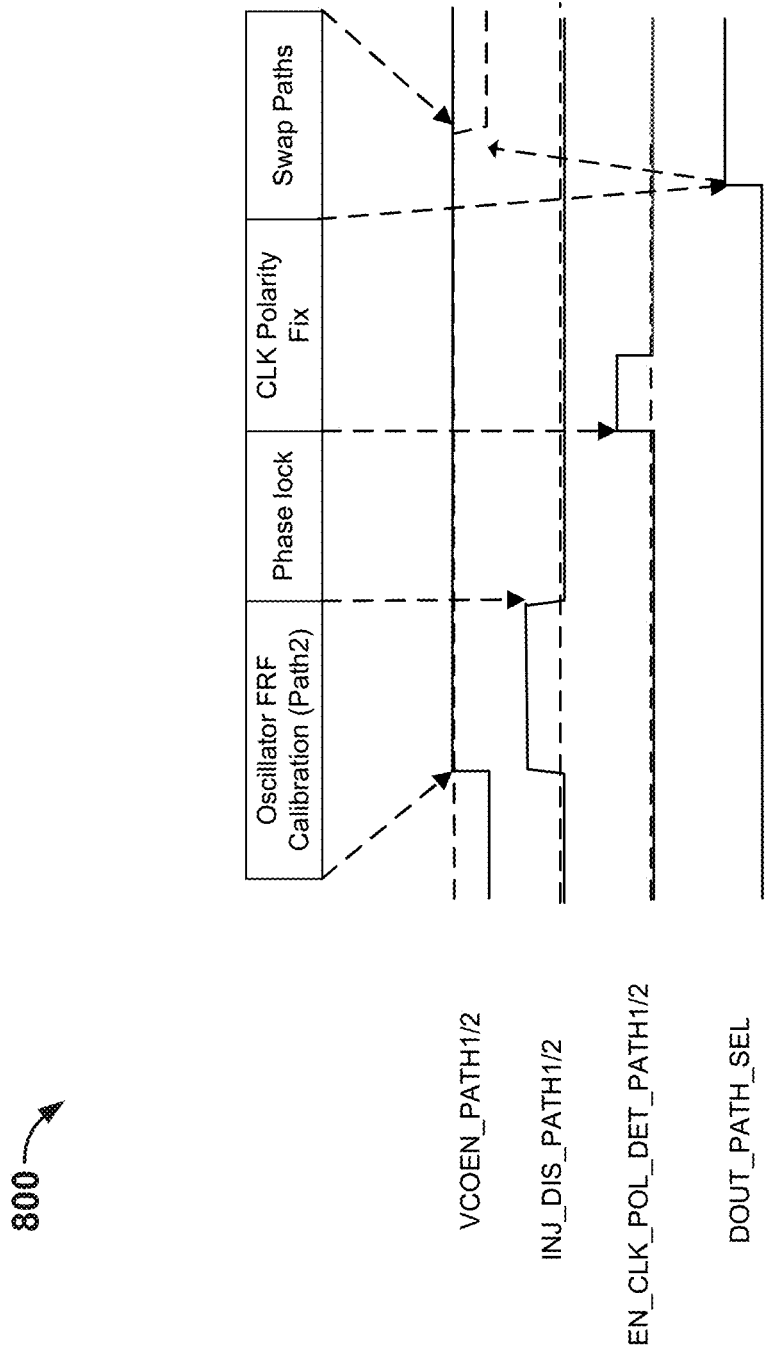
FIG. 8 is a timing diagram of a calibration operation.

FIG. 8 shows an example 800 of the actions during a background calibration operation. In this case, the example is of background oscillator FRF calibration of Path2 204, as performed between time $t_1$ and time $t_2$. However, background oscillator FRF calibration of Path1 203, as performed between time $t_3$ and time $t_4$, is similar. In this example, the signals on Path2 204 are shown in solid line, while the signals on Path1 203 are shown in dashed line.

In this example of calibration operation 800, Path2 204 to be calibrated has been in low-power mode. Therefore, at the beginning of operation 800, the ring oscillator enable signal for Path2, VCOEN_PATH2, is low, but is asserted to allow ring oscillator 224 to produce outputs. During this time, Path1 203 is operating, so the ring oscillator enable signal for Path1, VCOEN_PATH1, is high. However, at the end of operation 800, after Path2 204 has begun operating and Path1 203 ceases to operate, the ring oscillator enable signal for Path1, VCOEN_PATH1, goes low. It is noted that in an implementation in which calibration takes longer, so that there is no low power mode, both ring oscillator enable signals VCOEN_PATH1 and VCOEN_PATH2, would always be high.

After VCOEN_PATH2 is asserted to allow ring oscillator 224 to produce outputs, the INJ_DIS_PATH2 signal is asserted to disconnect ring oscillator 224 from the injection of pulse signal 212. Thus disconnected from pulse signal 212, ring oscillator 224 runs freely at the oscillator FRF determined by VDD, which is adjusted until the oscillator FRF is calibrated to the reference clock. The INJ_DIS_PATH2 signal is deasserted to reconnect ring oscillator 224 to pulse signal 212, and by injection locking, the crossing point of the ECK1_RING2 signal (323) and the ECK2_RING2 signal (313) will be aligned to the midpoint of pulse signal 212. Next, path 204 polarity detect enable signal EN_CLK_POL_DET_PATH2 is asserted so that the polarities of the Path2 204 signals can be reversed if necessary, as described above in connection with FIG. 6 (and in FIG. 5 for Path1 203). At this point, Path2 204 is ready for operation, and DOUT_PATH_SEL is set to Path2 204 to select Path2 204 at DATA_MUX 206 to swap paths. As noted above, at some point after the swap, in this example where the calibration occurs quickly enough to allow for a low-power mode, the ring oscillator enable signal for Path1, VCOEN_PATH1, goes low to turn off ring oscillator 223.

Figure 9:
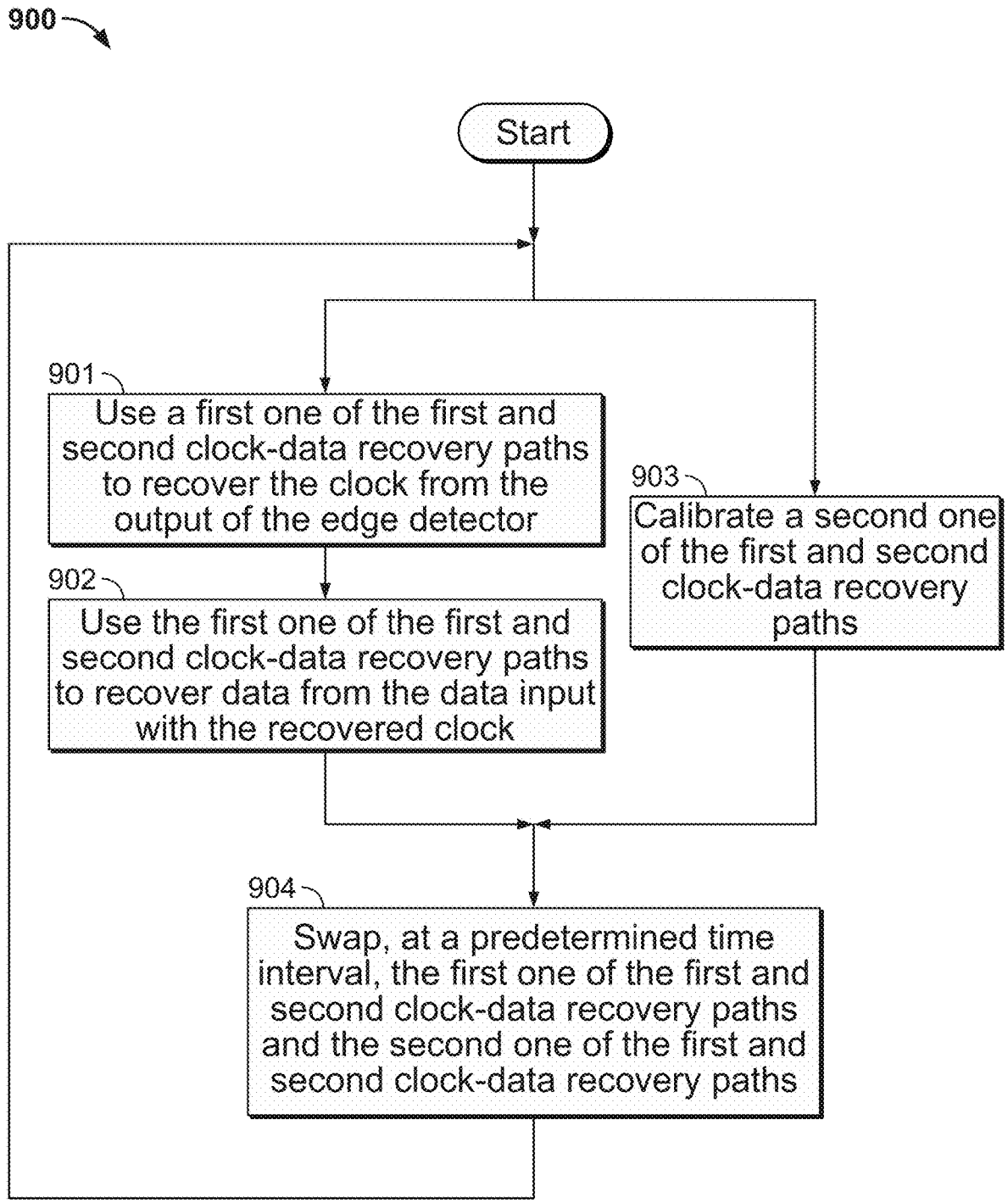
FIG. 9 is a flow diagram showing the operation of a method according to implementations of the subject matter of the present disclosure.

A method 900 according to implementations of the subject matter of the present disclosure is diagrammed in FIG. 9. At 901, a first one of the first and second clock-data recovery paths is used to recover the clock from the output of the edge detector, and then at 902, the first one of the first and second clock-data recovery paths is used to recover data from the date input with the recovered clock. At 903, at the same time that the first one of the first and second clock-data recovery paths is used to recover the clock from the output of the edge detector and to recover data from the data input, the second one of the first and second clock-data recovery paths is calibrated. At 904, at a predetermined time interval, the first one of the first and second clock-data recovery paths and the second one of the first and second clock-data recovery paths are swapped, and flow returns to 901 and 903.

Thus it is seen that a receiver structure using ILO-based CDR, having two injection-locked paths to maintain calibration, so that the ratio of the free-running frequency (FRF) of the injection-locked oscillator to the data rate can be kept constant, has been provided.

As used herein and in the claims which follow, the construction "one of A and B" shall mean "A or B." It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A data receiver, comprising:
a first data path;
a second data path; and
a controller to swap the first data path and the second data path upon each elapsing of a predetermined time interval, to alternately begin transferring data on one of the first data path and the second data path, and to begin calibrating a frequency source on another of the first data path and the second data path after the swap; wherein:
the predetermined time interval is selected, based on a target frequency and a target margin of frequency error, to be at most equal to an operational duration during which temperature drift will cause the other of the first data path and the second data path to lose calibration.

2. The data receiver of claim 1, further comprising:
a first enabling gate in the first data path;
a second enabling gate in the second data path; and
output multiplexer configured for selecting between an output of the first data path and an output of the second data path; wherein:
the controller is configured to swap from the first data path to the second data path by controlling a first signal to disable the first enabling gate, controlling a second signal to enable the second enabling gate, and controlling a selection signal of the output multiplexer to select the output of the second data path; and
the controller is configured to swap from the second data path to the first data path by controlling the first signal to enable the first enabling gate, controlling the second signal to disable the second enabling gate, and controlling the selection signal of the output multiplexer to select the output of the first data path.

3. The data receiver of claim 1, wherein the controller is configured to swap the one of the first data path and the second data path and the other of the first data path and the second data path whenever calibration of the other one of the first data path and the second data path is completed.

4. The data receiver of claim 1, wherein when calibration requires a calibration duration equal to the predetermined time interval the controller is configured to begin calibration of the other of the first data path and the second data path to be calibrated immediately after swapping of the one of the first data path and the second data path and the other of the first data path and the second data path.

5. The data receiver of claim 1, wherein when calibration requires a calibration duration shorter than the predetermined time interval the controller is configured to conserve power by delaying calibration of the other of the first and second data paths to be calibrated for a portion of the predetermined interval after swapping of the one of the first and second data paths and the other of the first and second data paths, and keeping the other of the first and second data paths to be calibrated in a low-power idle mode during the delaying.

6. The data receiver of claim 1, wherein each respective one of the first data path and the second data path further comprises circuitry configured to compare respective polarities of signals in the first data path and the second data path and to prevent signal discontinuities by adjusting the respective polarities of signals in the first data path and the second data path when the respective polarities of the signals in the first data path and the second data path are different.

7. The data receiver of claim 6 wherein:
the circuitry configured to compare respective polarities of signals in the first data path and the second data path comprises an exclusive-OR circuit having as inputs a corresponding signal from each of the first data path and the second data path; and the circuitry configured to adjust the polarities of signals in the first data path and the second data path when the polarities of the signals in the first data path and the second data path are different comprises at least one multiplexer controlled by an output of the exclusive-OR circuit.

8. A method of operating a data receiver having a first data path and a second data path, the method comprising:
swapping the first data path and the second data path upon each elapsing of a predetermined time interval, to alternately begin transferring data on one of the first data path and the second data path; and
beginning calibrating a frequency source on another of the first data path and the second data path after swapping the first data path and the second data path; wherein:
the predetermined time interval is selected, based on a target frequency and a target margin of frequency error, to be at most equal to an operational duration during which temperature drift will cause the other of the first data path and the second data path to lose calibration.

9. The method of claim 8, wherein:
swapping from the first data path to the second data path comprises controlling a first signal to disable the first enabling gate, controlling a second signal to enable the second enabling gate, and controlling a selection signal to select the output of the second data path; and
swapping from the second data path to the first data path comprises controlling the first signal to enable the first enabling gate, controlling the second signal to disable the second enabling gate, and controlling the selection signal to select the output of the first data path.

10. The method of claim 8 wherein the swapping comprises swapping the one of the first and second data paths and the other of the first data path and the second data path whenever calibration of the one of the first and second data paths is completed.

11. The method of claim 8 comprising, when calibration requires a calibration duration equal to the predetermined time interval the other of the first data path and the second data to be calibrated immediately after swapping of the first data path and the second data path.

12. The method of claim 8 comprising, when calibration requires a calibration duration shorter than the predetermined time interval reducing power consumption by delaying calibration of the other of the first data path and the second data path to be calibrated for a portion of the predetermined interval after swapping of the first data path and the second data path.

13. The method of claim 8 further comprising comparing respective polarities of signals in the first data path and the second data path and preventing signal discontinuities adjusting the respective polarities of signals in the first data path and the second data path when the respective polarities of the signals in the first data path and the second data path are different.

14. The method of claim 13 wherein:
comparing respective polarities of signals in the first data path and the second data path comprises performing an exclusive-OR operation on a corresponding signal from each of the first data path and the second data path; and
adjusting the polarities of signals in the first data path and the second data path when the respective polarities of the signals in the first data path and the second data path are different comprises multiplexing the signals under control of an output of the exclusive-OR operation.

* * * * *